(12) United States Patent
Marin et al.

(10) Patent No.: US 12,481,108 B2
(45) Date of Patent: Nov. 25, 2025

(54) FARADAY ROTATOR INTERCONNECT AS A THROUGH-VIA CONFIGURATION IN A PATCH ARCHITECTURE

(71) Applicant: Intel Corporation, Santa Clara, CA (US)

(72) Inventors: Brandon C. Marin, Gilbert, AZ (US); Divya Pratap, Hillsboro, OR (US); Hiroki Tanaka, Chandler, AZ (US); Nitin Deshpande, Chandler, AZ (US); Omkar Karhade, Chandler, AZ (US); Robert Alan May, Chandler, AZ (US); Sri Ranga Sai Boyapati, Chandler, AZ (US); Srinivas V. Pietambaram, Chandler, AZ (US); Xiaoqian Li, Chandler, AZ (US); Sai Vadlamani, Gilbert, AZ (US); Jeremy Ecton, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 1047 days.

(21) Appl. No.: 17/122,340

(22) Filed: Dec. 15, 2020

(65) Prior Publication Data

US 2022/0187548 A1 Jun. 16, 2022

(51) Int. Cl.
*G02B 6/42* (2006.01)
*G02F 1/01* (2006.01)
(Continued)

(52) U.S. Cl.
CPC ......... *G02B 6/4213* (2013.01); *G02F 1/0136* (2013.01); *G02F 1/09* (2013.01); *G02B 6/4268* (2013.01); *H01L 23/5381* (2013.01)

(58) Field of Classification Search
CPC .... G02B 6/4268; G02B 6/4213; G02F 1/0136
See application file for complete search history.

(56) References Cited

U.S. PATENT DOCUMENTS

| 5,577,140 A | 11/1996 | Endo | |
| 7,373,033 B2 * | 5/2008 | Lu | G02B 6/4246 257/432 |

(Continued)

FOREIGN PATENT DOCUMENTS

| EP | 1168021 | 1/2002 | |
| EP | 1168021 A2 * | 1/2002 | ........... G02B 6/4208 |
| WO | WO-2017106880 A1 * | 6/2017 | ......... G02B 6/12004 |

OTHER PUBLICATIONS

Chandrasekhar Arun et al: "Server CPU Package Design Using PoINT Architecture",2019 IEEE 69th Electronic Components andTechnology Conference (ECTC), IEEE,May 28, 2019 (May 28, 2019), pp. 2180-2185, XP033603932, DOI: 10.1109/ECTC.2019. 00-20[retrieved on Aug. 22, 2019].

(Continued)

*Primary Examiner* — Uyen Chau N Le
*Assistant Examiner* — Hoang Q Tran
(74) *Attorney, Agent, or Firm* — Schwabe, Williamson & Wyatt P.C.

(57) ABSTRACT

Embodiments disclosed herein include optical systems with Faraday rotators in order to enhance efficiency. In an embodiment, a photonics package comprises an interposer and a patch over the interposer. In an embodiment, the patch overhangs an edge of the interposer. In an embodiment, the photonics package further comprises a photonics die on the patch and a Faraday rotator passing through a thickness of the patch. In an embodiment, the Faraday rotator is below the photonics die.

19 Claims, 17 Drawing Sheets

(51) Int. Cl.
G02F 1/09 (2006.01)
H01L 23/538 (2006.01)

(56) References Cited

U.S. PATENT DOCUMENTS

| | | | | |
|---|---|---|---|---|
| 2005/0220163 A1* | 10/2005 | Okuta | ................ | G02B 6/02138 |
| | | | | 372/92 |
| 2010/0006784 A1* | 1/2010 | Mack | ....................... | G02B 6/43 |
| | | | | 250/551 |
| 2012/0314992 A1* | 12/2012 | Lee | ..................... | G02B 6/4202 |
| | | | | 385/14 |
| 2014/0177625 A1 | 6/2014 | Chang | | |
| 2014/0321803 A1* | 10/2014 | Thacker | ............... | G02B 6/4274 |
| | | | | 385/14 |
| 2016/0344157 A1* | 11/2016 | Chou | ................... | H01S 3/2308 |

OTHER PUBLICATIONS

Search Report from European Patent Application No. 21198382.0, mailed Feb. 24, 2022, 6 pgs.
Notice of Allowance from European Patent Application No. 21198382.0, mailed Nov. 12, 2025, 53 pgs.

* cited by examiner

FARADAY ROTATOR INTERCONNECT AS A THROUGH-VIA CONFIGURATION IN A PATCH ARCHITECTURE

TECHNICAL FIELD

Embodiments of the present disclosure relate to electronic packages, and more particularly to photonics packages with a Faraday rotator between an optical cable and the photonics die.

BACKGROUND

The microelectronic industry has begun using optical connections as a way to increase bandwidth and performance. Typically, an optical fiber is coupled to a photonics die. The current coupling architectures include direct coupling between the interfaces. Such direct coupling does not fundamentally improve signal-to-noise ratios. In fact, these direct light coupling architectures may result in reflected light at the interface. The reflected light generates optical interference. The optical interference decreases the signal-to-noise ratio and can even result in inaccurate signals being propagated to the receivers.

EMBODIMENTS OF THE PRESENT DISCLOSURE

Described herein are photonics packages with a Faraday rotator between an optical cable and the photonics die, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, direct optical coupling between an optical cable and the photonics die leads to low signal-to-noise ratios. For example, reflections at the interface may be particularly problematic and leads to poor signal quality. Accordingly, embodiments disclosed herein include the integration of Faraday rotators into the photonics package architectures. An example schematic of the functioning of a Faraday rotator 160 is shown in FIG. 1.

Figure 1:
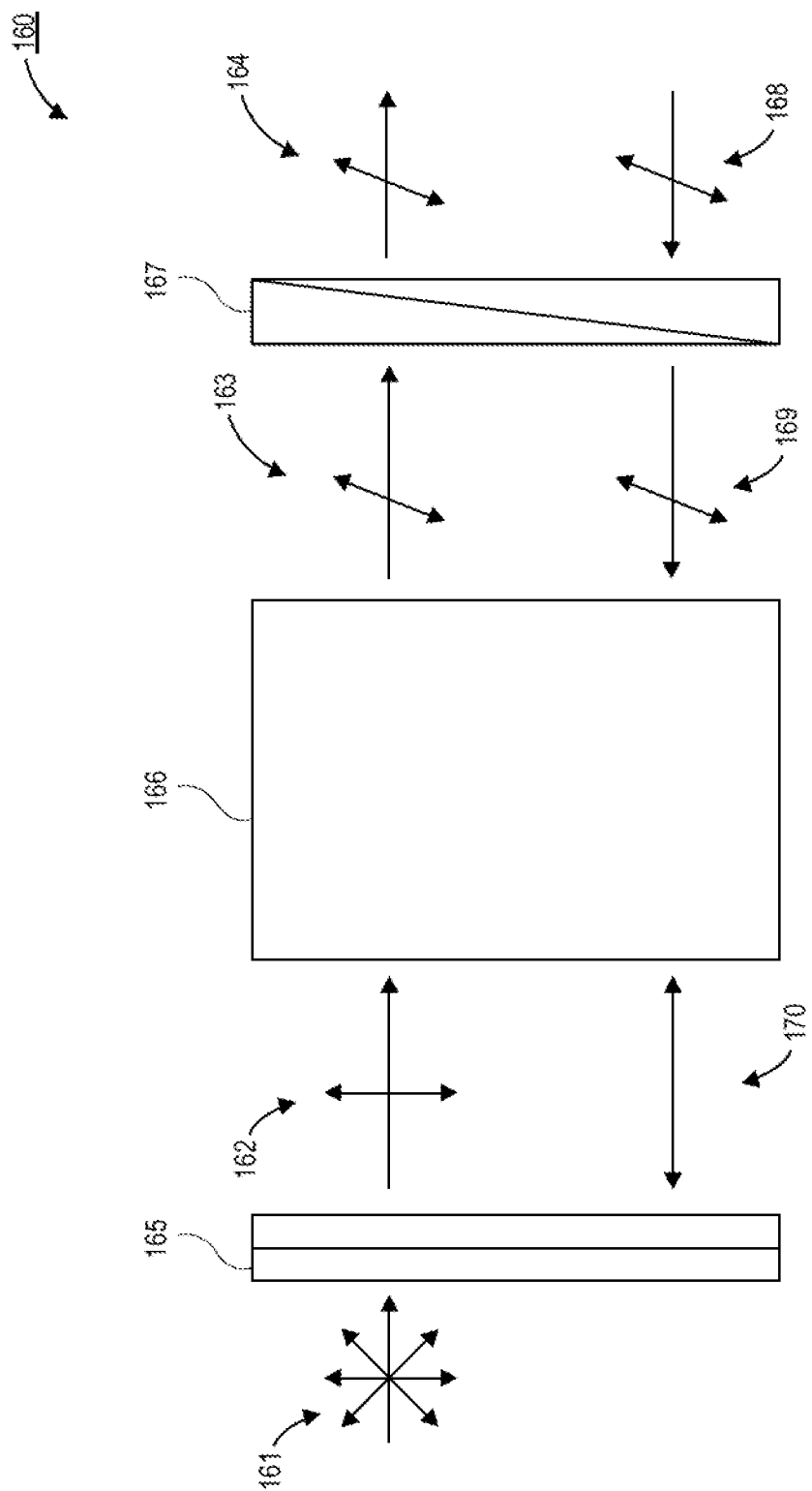
FIG. 1 is a schematic illustrating how a Faraday rotator functions, in accordance with an embodiment.

As shown in FIG. 1, the Faraday rotator 160 comprises a first polarizer 165, a magnetic region 166, and a second polarizer 167 on the opposite side of the magnetic region 166 from the first polarizer 165. Incoming light 161 may have random polarization. After passing through the first polarizer 165, the light 162 may be vertically polarized. In an embodiment, the light 162 propagates through the magnetic region 166 where the magnetic field results in the polarization being shifted, as shown in light 163. For example, a 45° polarization shift may be provided in some embodiments. Light 163 then passes through the second polarizer 167, which restricts light to only the selected polarization shift induced by the magnetic region 166, as shown by light 164. In light passing the opposite direction (i.e., light 168, 169, and 170), the angled polarized light 168 and 169 passes back through the magnetic region 166. The magnetic region 166 again shifts the polarization. For example, when a 45° polarization is used, the polarization of the light 169 is further shifted so that light 170 is 90° polarized. It is to be appreciated that such a Faraday architecture may result in the filtering out of reflections from the optical path. As such, the signal-to-noise ratio is increased, and performance of the optical interconnects are improved.

Figure 2:
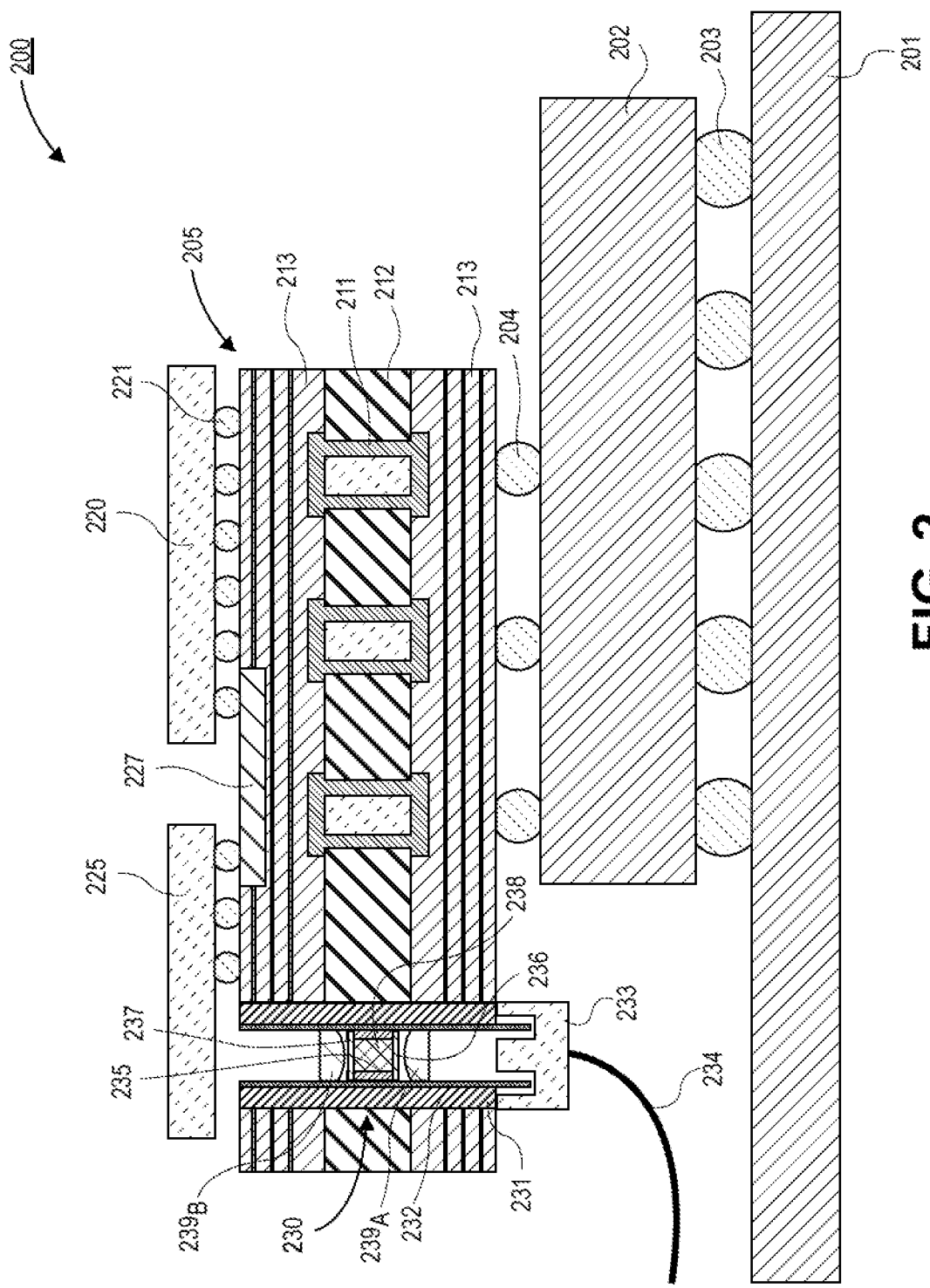
FIG. 2 is a cross-sectional illustration of a photonics package that comprises a Faraday rotator in a package on interposer (PoINT) architecture, in accordance with an embodiment.

Referring now to FIG. 2, a cross-sectional illustration of an electronic system 200 is shown, in accordance with an embodiment. In an embodiment, the electronic system 200 comprises a patch on interposer (PoINT) architecture. The PoINT architecture may comprise a board 201. The board 201 may be a printed circuit board (PCB) or the like. In an embodiment, an interposer 202 is attached to the board 201 by interconnects 203. The interconnects 203 are shown as being solder balls, but it is to be appreciated that any interconnect architecture may be used, such as sockets or the like.

In an embodiment, the interposer 202 may comprise conductive routing (not shown). The conductive routing within the interposer 202 may allow for conductive coupling between a top surface and a bottom surface of the interposer 202. For example, the conductive routing may comprise pads, traces, vias, and the like.

In an embodiment, a patch 205 is attached to the interposer 202. For example, the patch 205 may be coupled to the interposer 202 by interconnects 204, such as solder balls or the like. In an embodiment, the patch 205 comprises a core 212 and conductive routing layers 213 above and below the core 212. Through core vias 211 may conductively couple the top routing layer 213 to the bottom routing layer 213. However, it is to be appreciated that in some embodiments, a coreless patch 205 may also be used.

In an embodiment, the patch 205 may comprise a compute die 220 and a photonics die 225. The compute die 220 may be any type of die, such as, but not limited to a processor, a graphics processor, a field-programmable gate array (FPGA), a system on a chip (SoC), a memory, or the like. In an embodiment, the photonics die 225 comprises features for converting signals between the optical regime and the electrical regime. For example, the photonics die 225 may comprise a laser and/or a photodiode. In an embodiment, the compute die 220 is communicatively coupled to the photonics die 225 by a bridge 227 that is embedded in the top routing layer 213 of the patch 205. The bridge 227 provides a dimensionally stable substrate on which high density conductive routing can be provided.

In an embodiment, the patch 205 is arranged so that it overhangs an edge of the interposer 202. For example, the patch 205 in FIG. 2 overhangs the left edge of the interposer 202. Overhanging the interposer 202 allows for a bottom surface of the patch 205 to be exposed. Particularly, a space between the underlying board 201 and the bottom surface of the patch 205 is sufficient to provide an optical connection to the photonics die 225 from below. In a particular embodiment, an optical cable 234 is connected to a connector 233. The connector 233 interfaces with a Faraday rotator 230 that passes through a thickness of the patch 205. In an embodiment, the Faraday rotator 230 is positioned within a footprint of the photonics die 225. As such, an optical path is provided through the Faraday rotator 230 from the connector 233 to the photonics die 225.

In an embodiment, the Faraday rotator 230 comprises a housing 232. The housing 232 may be a tube. In an embodiment, the housing 232 is mechanically coupled to the patch 205 by a dielectric layer 231. As will be described below, the dielectric layer 231 is a material that expands during a heat treatment. As such, the Faraday rotator 230 can be inserted into the patch 205, and the heat treatment secures the Faraday rotator 230 to the patch 205.

In an embodiment, the Faraday rotator 230 may comprise a first polarizer 236 and a second polarizer 237. The first polarizer 236 may be a vertical polarizer and the second polarizer 237 may be an angled polarizer (e.g., 45°). That is, the first polarizer 236 may be different than the second polarizer 237. In an embodiment, a magnetic region is provided between the first polarizer 236 and the second polarizer 237. The magnetic region may comprise a permanent magnet 235. The permanent magnet 235 may be a shell that wraps around an optically clear layer 238. The permanent magnet 235 has a magnetic field that modifies the orientation of the incoming vertically polarized light. For example, the permanent magnet 235 may result in 45° polarized light in some embodiments.

In an embodiment, the efficiency of the Faraday rotator 230 may be further improved by including lenses. For example, a first lens 239A may be provided between the first polarizer 236 and the connector 233, and a second lens 239B may be provided between the second polarizer 237 and the photonics die 225.

Referring now to FIGS. 3A-3D, a series of cross-sectional illustrations depicting a process for fabricating a patch 305 is shown, in accordance with an embodiment. The patch 305 in FIGS. 3A-3D may be substantially similar to the patch 205 in FIG. 2.

Figure 3A:
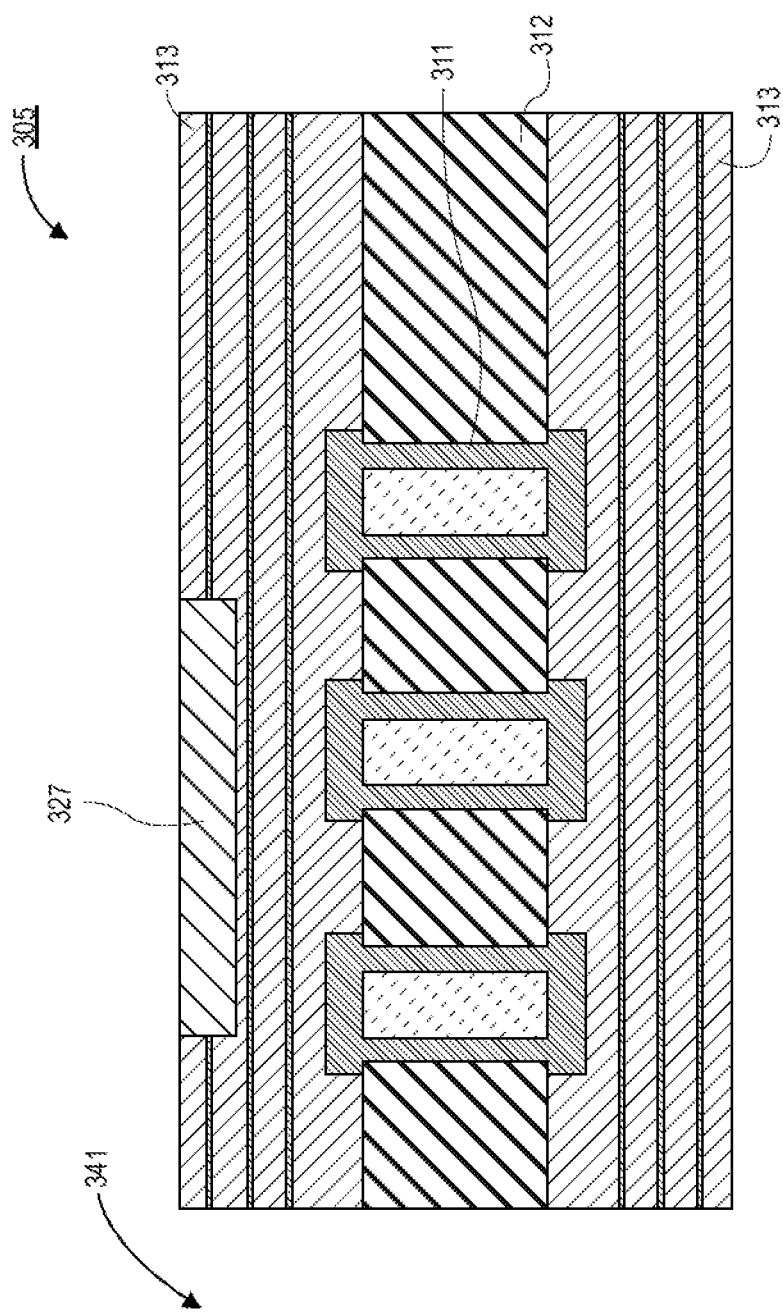
FIG. 3A is a cross-sectional illustration of a patch with a through hole, in accordance with an embodiment.
Figure 3A:
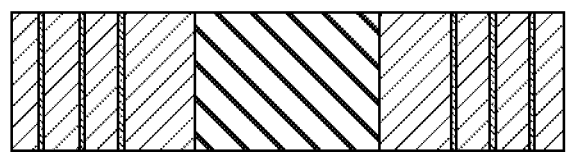

Referring now to FIG. 3A, a cross-sectional illustration of a patch 305 is shown, in accordance with an embodiment. In an embodiment, the patch 305 may comprise a core 312 with routing layers 313 above and below the core 312. Through core vias 311 may electrically couple the top routing layers 313 to the bottom routing layers 313. In yet another embodiment, the patch 305 may be coreless. In the illustrated embodiment, conductive traces are shown in the routing layers 313. However, it is to be appreciated that conductive vias, traces, and pads may be provided in the routing layers 313 in order to provide the necessary conductive routing. In an embodiment, a bridge 327 for providing high density routing may also be provided in the top routing layers 313.

In an embodiment, a hole 341 is formed through the patch 305. The hole 341 may be formed with any drilling process. For example, the hole 341 may be mechanically drilled or drilled with a laser. In the case of a laser drilled hole, the sidewalls of the hole 341 may be tapered, as is common in laser drilled architectures. The hole 341 passes through the top routing layers 313, the core 312, and the bottom routing layers 313. That is, the hole 341 extends through an entire thickness of the patch 305.

Figure 3B:
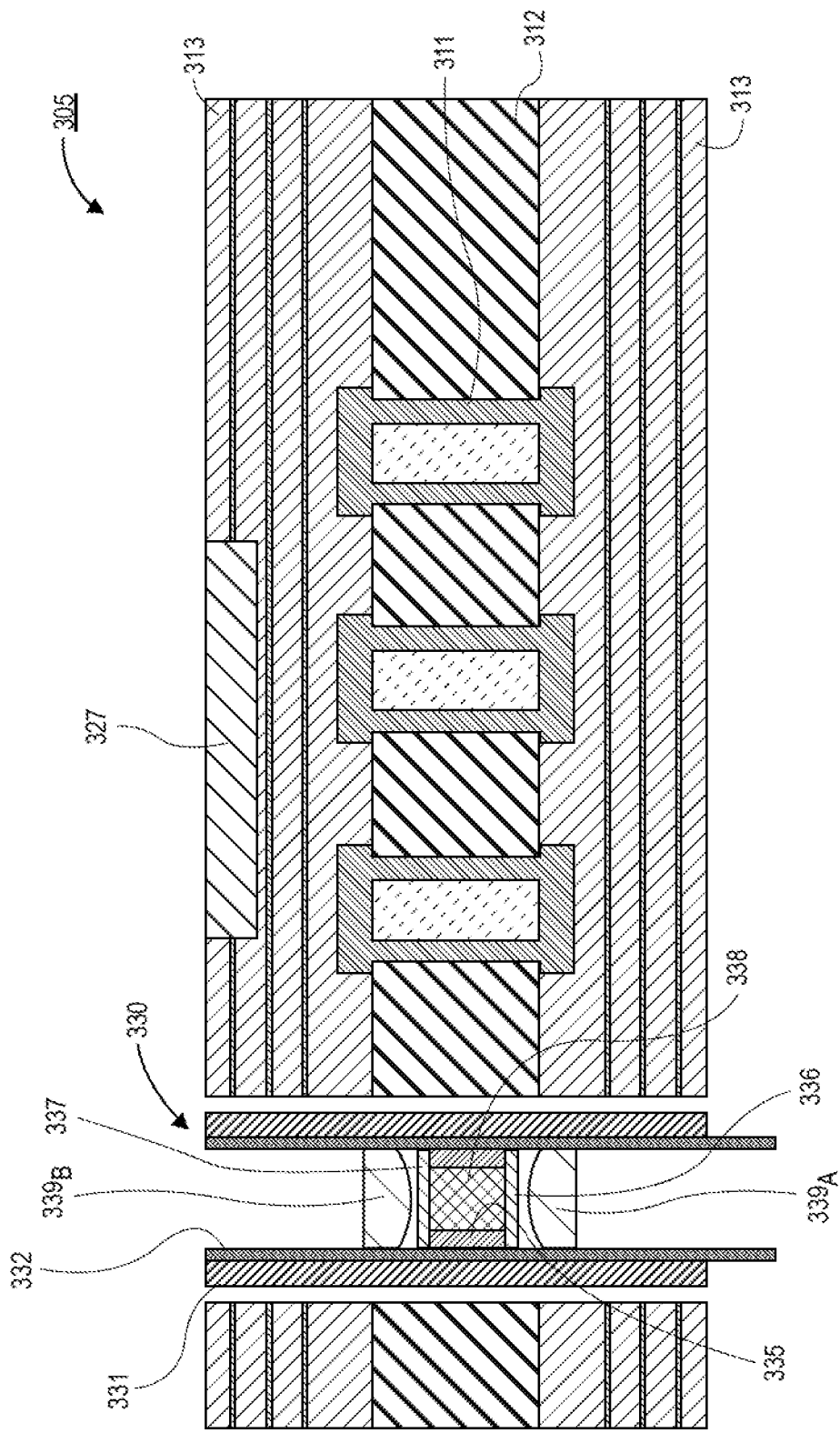
FIG. 3B is a cross-sectional illustration of the patch after a Faraday rotator is inserted into the through hole, in accordance with an embodiment.

Referring now to FIG. 3B, a cross-sectional illustration of the patch 305 after Faraday rotator 330 is inserted into the hole 341 is shown, in accordance with an embodiment. In an embodiment, the Faraday rotator 330 comprise a housing 332 that is tubular. An outer surface of the housing 332 may be lined with a dielectric material 331. In an initial state, the outer diameter of the dielectric material 331 may be smaller than a diameter of the hole 341.

In an embodiment, the Faraday rotator 330 may comprise a first polarizer 336 and a second polarizer 337. The first polarizer 336 may be a vertical polarizer and the second polarizer 337 may be an angled polarizer (e.g., 45°). That is, the first polarizer 336 may be different than the second polarizer 337. In an embodiment, a magnetic region is provided between the first polarizer 336 and the second polarizer 337. The magnetic region may comprise a permanent magnet 335. The permanent magnet 335 may be a shell that wraps around an optically clear layer 338. While shown as a physical layer in FIG. 3B, it is to be appreciated that the permanent magnet 335 may have an air core in some embodiments. The permanent magnet 335 has a magnetic field that modifies the orientation of the incoming vertically polarized light. For example, the permanent magnet 335 may result in 45° polarized light in some embodiments.

In an embodiment, the permanent magnet 335 may be in direct contact with the first polarizer 336 and the second polarizer 337. For example, a bottom surface of the permanent magnet 335 may be in direct contact with a top surface of the first polarizer 336, and a top surface of the permanent magnet 335 may be in direct contact with a bottom surface of the second polarizer 337. The permanent magnet 335 may have an outer diameter that is substantially equal to diameters of the first polarizer 336 and the second polarizer 337.

In an embodiment, the Faraday rotator 330 may also comprise a first lens 339A and a second lens 339B. The first lens 339A is within the housing below the first polarizer 336, and the second lens 339B is within the housing above the second polarizer 337. The lenses 339A and 339B allow for improved efficiency by focusing the light passing through the Faraday rotator 330.

In the illustrated embodiment, the first polarizer 336, the second polarizer 337, and the permanent magnet 335 are positioned at approximately a midpoint of the housing 332. That is, the first polarizer 336, the second polarizer 337, and the permanent magnet 335 are positioned substantially within the core 312 of the patch 305. However, it is to be appreciated that the first polarizer 336, the second polarizer 337, and the permanent magnet 335 may be positioned at any vertical location within the patch 305. Additionally, while shown as be directly in contact with each other, embodiments may include spacings between one or more of the first polarizer 336, the second polarizer 337, and the permanent magnet 335.

Figure 3C:
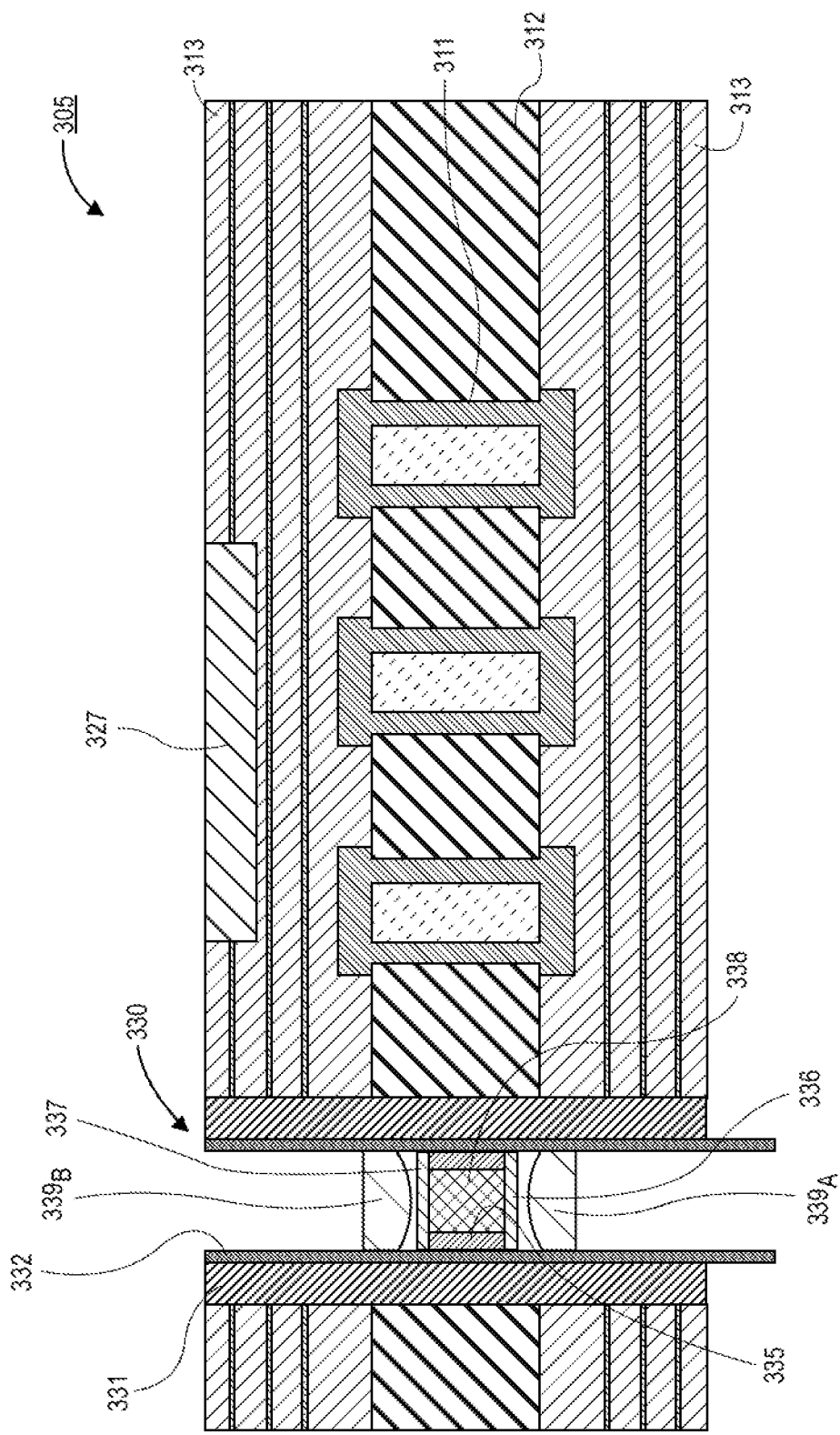
FIG. 3C is a cross-sectional illustration of the patch after a thermal treatment that expands a dielectric to mechanically couple the Faraday rotator to the patch, in accordance with an embodiment.

Referring now to FIG. 3C, a cross-sectional illustration of the patch 305 after a thermal treatment is shown, in accordance with an embodiment. In an embodiment, the thermal treatment may be at an elevated temperature (e.g., 300° C. or more) for a designated period of time. The heat treatment induces a physical change in the dielectric material 331. Particularly, an outer diameter of the dielectric material 331 is increased by the heat treatment. For example, the outer diameter of the dielectric material 331 may expand to completely fill the hole 341. As such, the dielectric material 331 mechanically couples the Faraday rotator 330 to the patch 305.

Figure 3D:
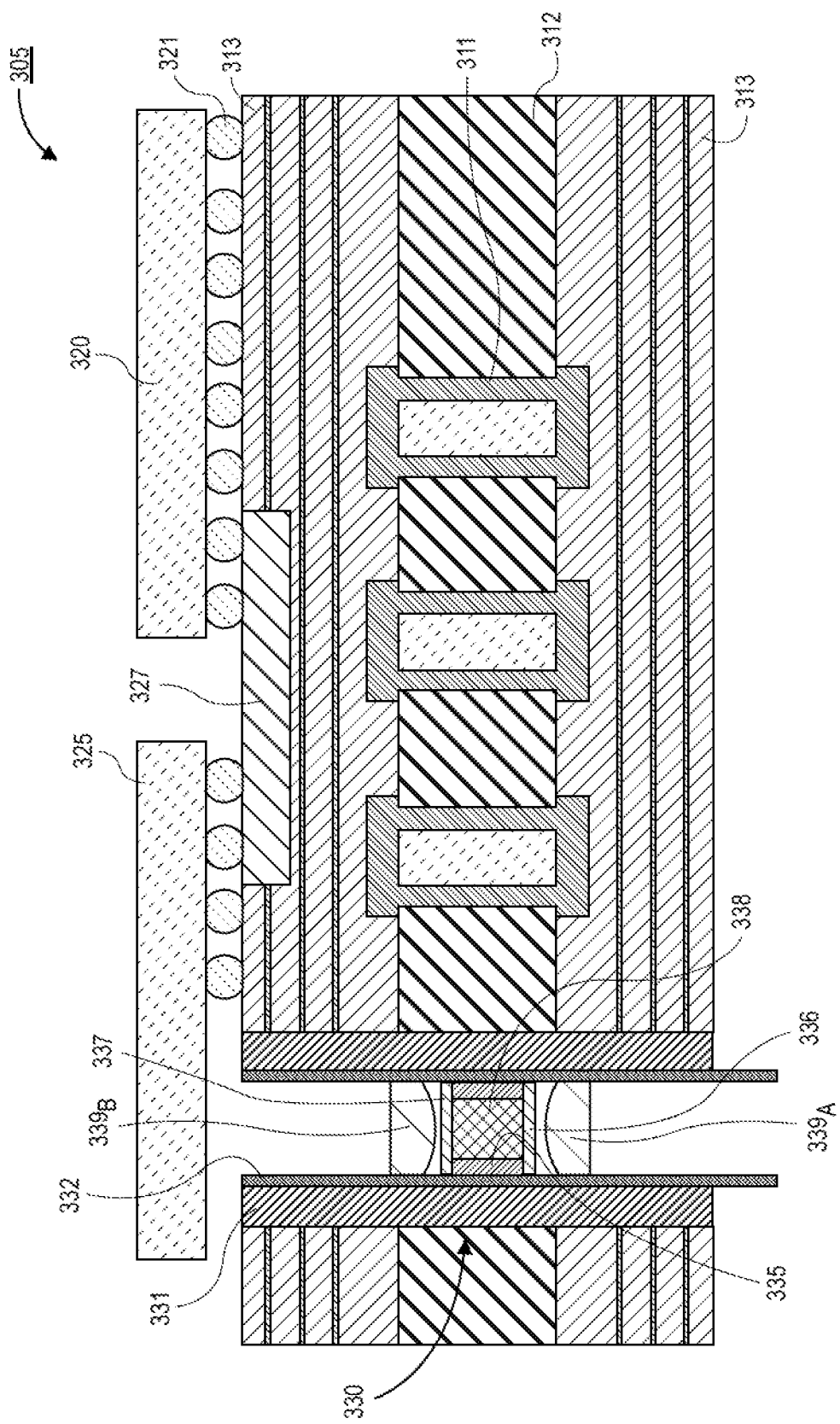
FIG. 3D is a cross-sectional illustration of the patch after a photonics die and a compute die are attached, in accordance with an embodiment.

Referring now to FIG. 3D, a cross-sectional illustration of the patch 305 after a compute die 320 and a photonics die 325 are attached is shown, in accordance with an embodiment. In an embodiment, the compute die 320 and the photonics die 325 may be attached to the patch by interconnects 321. While shown as solder balls, it is to be appreciated that the interconnects 321 may be any first level interconnect (FLI). The photonics die 325 may be communicatively coupled to the compute die 320 by the bridge 327 in the top routing layers 313. In an embodiment, the photonics die 325 extends over the Faraday rotator 330. That is, the Faraday rotator 330 may be within a footprint of the photonics die 325. As such, optical signals propagating through the Faraday rotator 330 may be optically coupled to a bottom surface of the photonics die 325.

After attachment of the photonics die 325 and the compute die 320, the patch 305 may be assembled with an electronic system, such as the electronic system 200 in FIG. 2. That is, the patch 305 may be arranged so that it overhangs an edge of an interposer. As such, room for attaching a connector (not shown in FIG. 3D) to a bottom of the housing 332 is provided.

Figure 4:
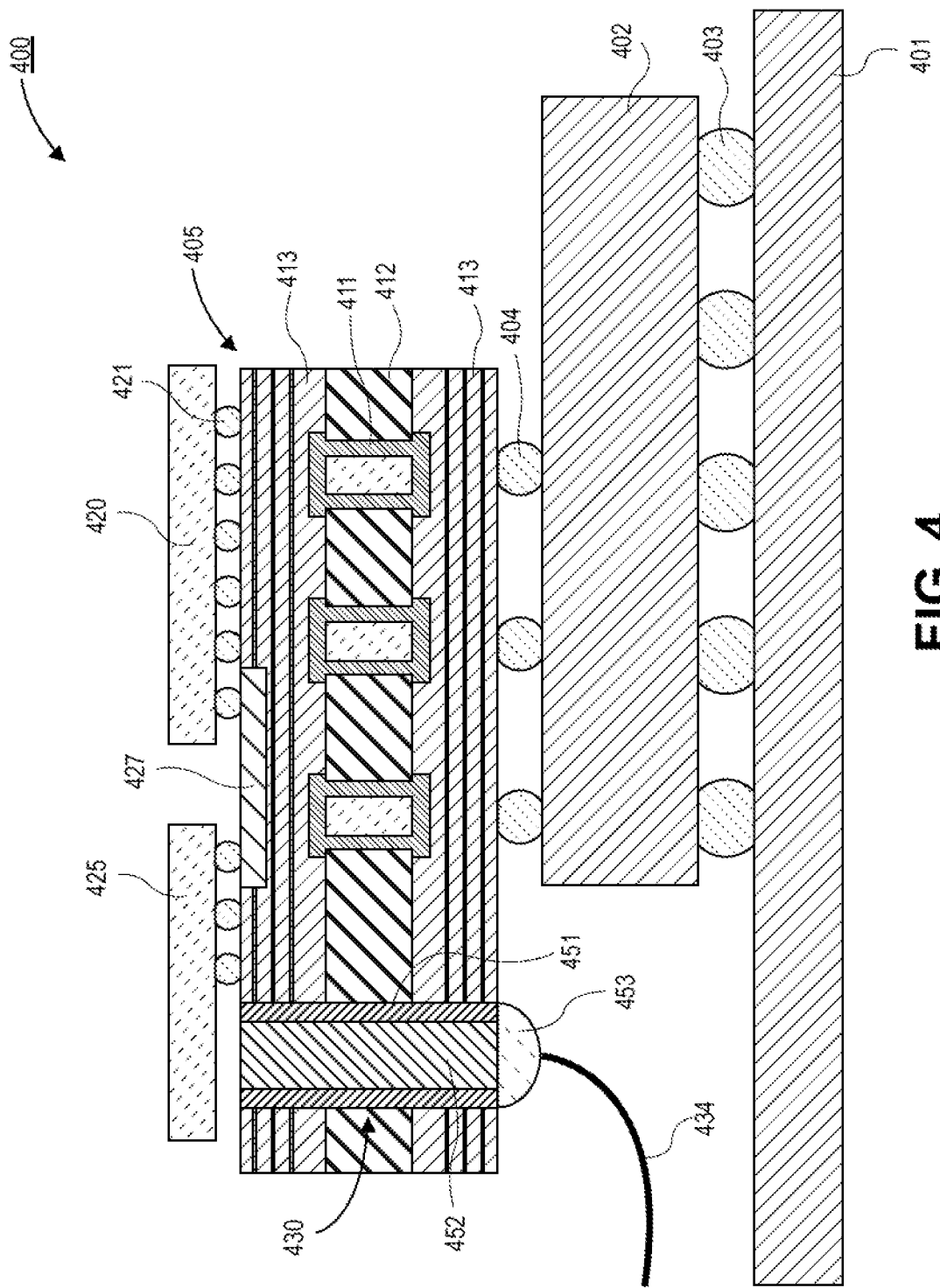
FIG. 4 is a cross-sectional illustration of a photonics package that comprises an integrated Faraday rotator in a PoINT architecture, in accordance with an embodiment.

Referring now to FIG. 4, a cross-sectional illustration of an electronic system 400 is shown, in accordance with an additional embodiment. In an embodiment, the electronic system 400 comprises a board 401, such as a PCB. An interposer 402 is attached to the board 401 by interconnects 403. In an embodiment, a patch 405 is attached to the interposer 402 by interconnects 404. The system level architecture of electronic system 400 may be substantially similar to the system level architecture of electronic system 200 in FIG. 2. For example, the patch 405 may overhang an edge of the underlying interposer 402.

In an embodiment, the patch 405 may comprise a core 412 with conductive routing layers 413 above and below the core 412. Through core vias 411 may electrically couple the top routing layers 413 to the bottom routing layers 413. In other embodiments, the patch 405 may be coreless. In an embodiment, a compute die 420 and a photonics die 425 are attached to the patch 405 by interconnects 421. Interconnects 421 may be any suitable FLIs. The compute die 420 may be communicatively coupled to the photonics die 425 by a bridge 427 embedded in the top routing layers 413.

In an embodiment, the patch 405 comprises a Faraday rotator 430. The Faraday rotator 430 may be integrated with the patch 405. That is, instead of being a discrete component (as is the case in FIG. 2), the Faraday rotator 430 is assembled as part of the patch 405 during fabrication of the patch 405. Such an integrated process is described in greater detail below.

In an embodiment, the Faraday rotator 430 comprises a magnetic shell 451 and an optically clear core 452. The magnetic shell 451 may be in direct contact with the routing layers 413 and the core 412. That is, there may be no housing between the magnetic shell 451 and the substrate of the patch 405. However, in other embodiments, a liner (not shown) may separate the magnetic shell 451 from the substrate of the patch 405. In an embodiment, a lens 453 may be provided at a bottom of the Faraday rotator 430. The lens 453 may be coupled to an optical cable 434.

While there are no polarizers shown in FIG. 4, it is to be appreciated that embodiments may comprise a pair of polarizers provided on opposite ends of the magnetic shell 451. In other embodiments, the Faraday rotator 430 may be used without the polarizers.

Referring now to FIGS. 5A-5E, a series of cross-sectional illustrations depicting a process for fabricating a patch 505 is shown, in accordance with an embodiment. The patch 505 in FIGS. 5A-5E may be substantially similar to the patch 405 in FIG. 4.

Figure 5A:
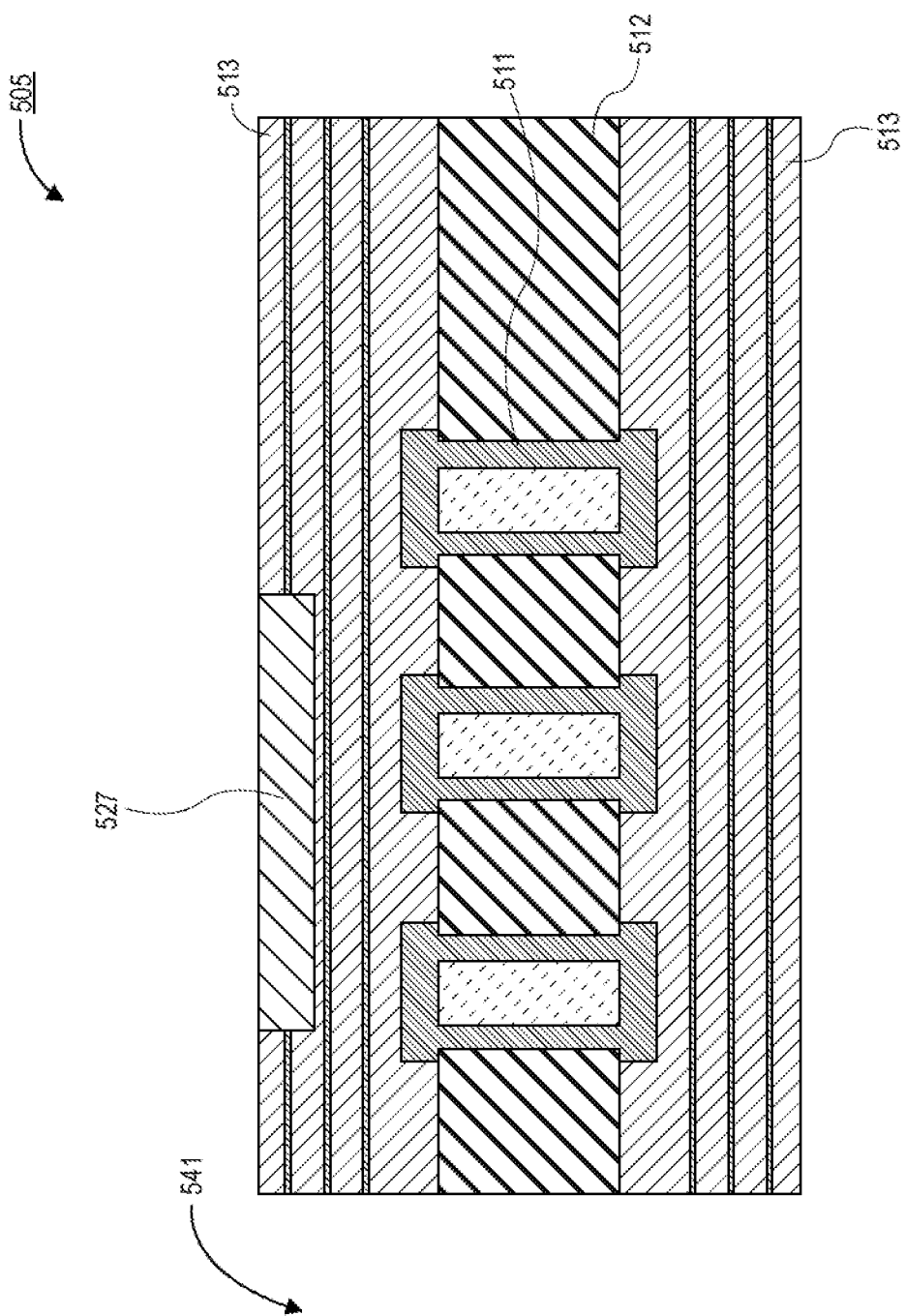
FIG. 5A is a cross-sectional illustration of a patch with a through hole, in accordance with an embodiment.
Figure 5A:
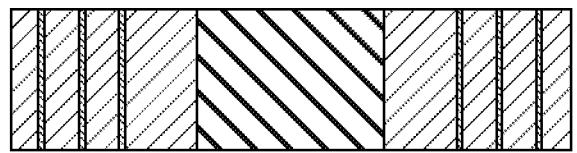

Referring now to FIG. 5A, a cross-sectional illustration of a patch 505 is shown, in accordance with an embodiment. In an embodiment, the patch 505 may comprise a core 512 with routing layers 513 above and below the core 512. Through core vias 511 may electrically couple the top routing layers 513 to the bottom routing layers 513. In yet another embodiment, the patch 505 may be coreless. In the illustrated embodiment, conductive traces are shown in the routing layers 513. However, it is to be appreciated that conductive vias, traces, and pads may be provided in the routing layers 513 in order to provide the necessary conductive routing. In an embodiment, a bridge 527 for providing high density routing may also be provided in the top routing layers 513.

In an embodiment, a hole 541 is formed through the patch 505. The hole 541 may be formed with any drilling process. For example, the hole 541 may be mechanically drilled or drilled with a laser. In the case of a laser drilled hole, the sidewalls of the hole 541 may be tapered, as is common in laser drilled architectures. The hole 541 passes through the top routing layers 513, the core 512, and the bottom routing layers 513. That is, the hole 541 extends through an entire thickness of the patch 505.

Figure 5B:
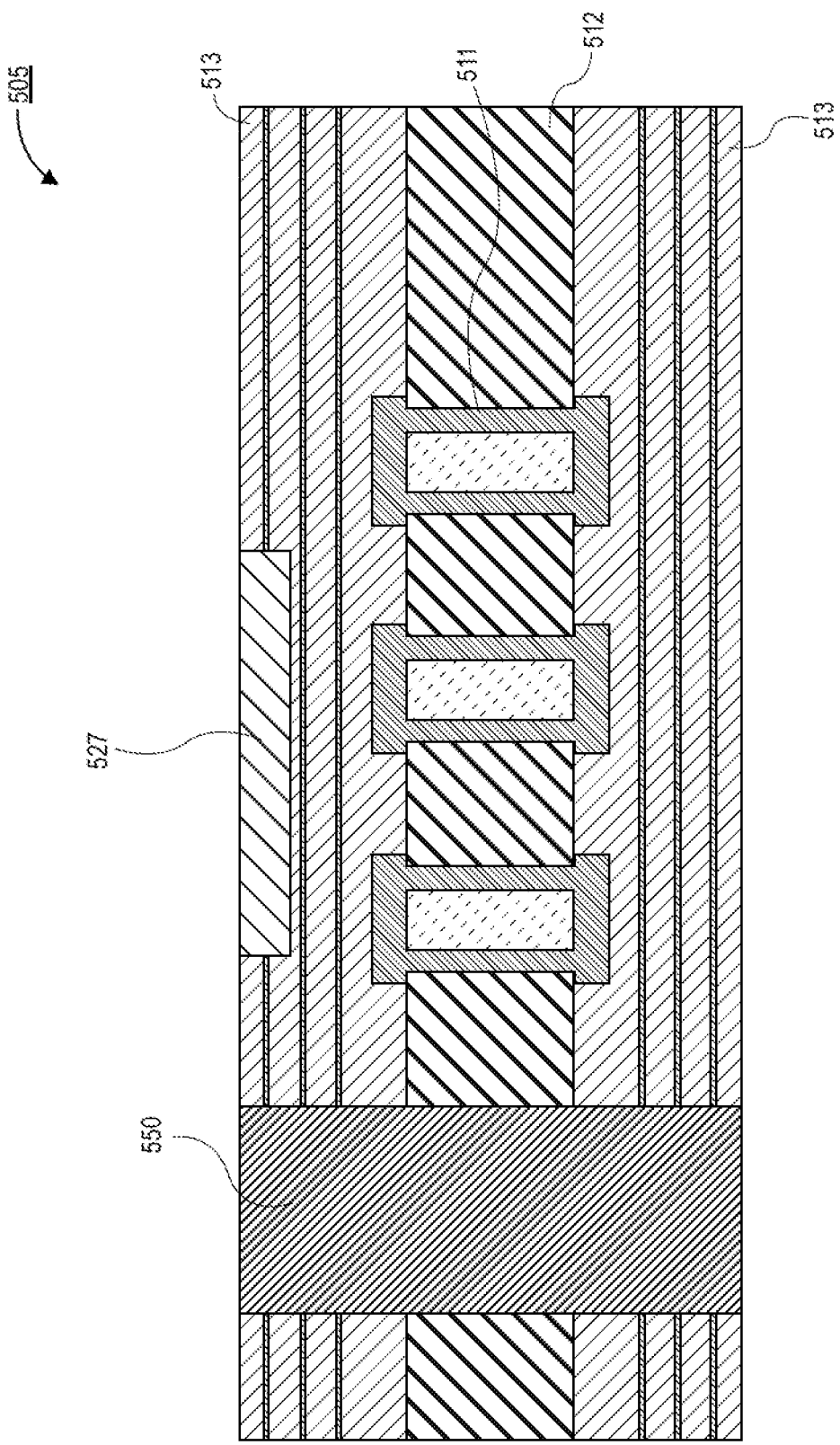
FIG. 5B is a cross-sectional illustration of the patch after a magnetic material is disposed in the through hole, in accordance with an embodiment.

Referring now to FIG. 5B, a cross-sectional illustration of the patch 505 after a magnetic plug 550 is provided in the hole 541 is shown, in accordance with an embodiment. In the illustrated embodiment, the magnetic plug 550 may be in direct contact with the surfaces of the routing layers 513 and the core 512, as shown in FIG. 5B. In other embodiments, a conductive liner may be disposed over the surfaces of the hole 541 prior to disposing the magnetic plug 550. That is, in some embodiments, the magnetic plug 550 is separated from the routing layers 513 and the core 512 by a conductive layer, such as copper. In an embodiment, the magnetic plug 550 may be dispensed with any suitable process, such as, but not limited to, paste printing.

Figure 5C:
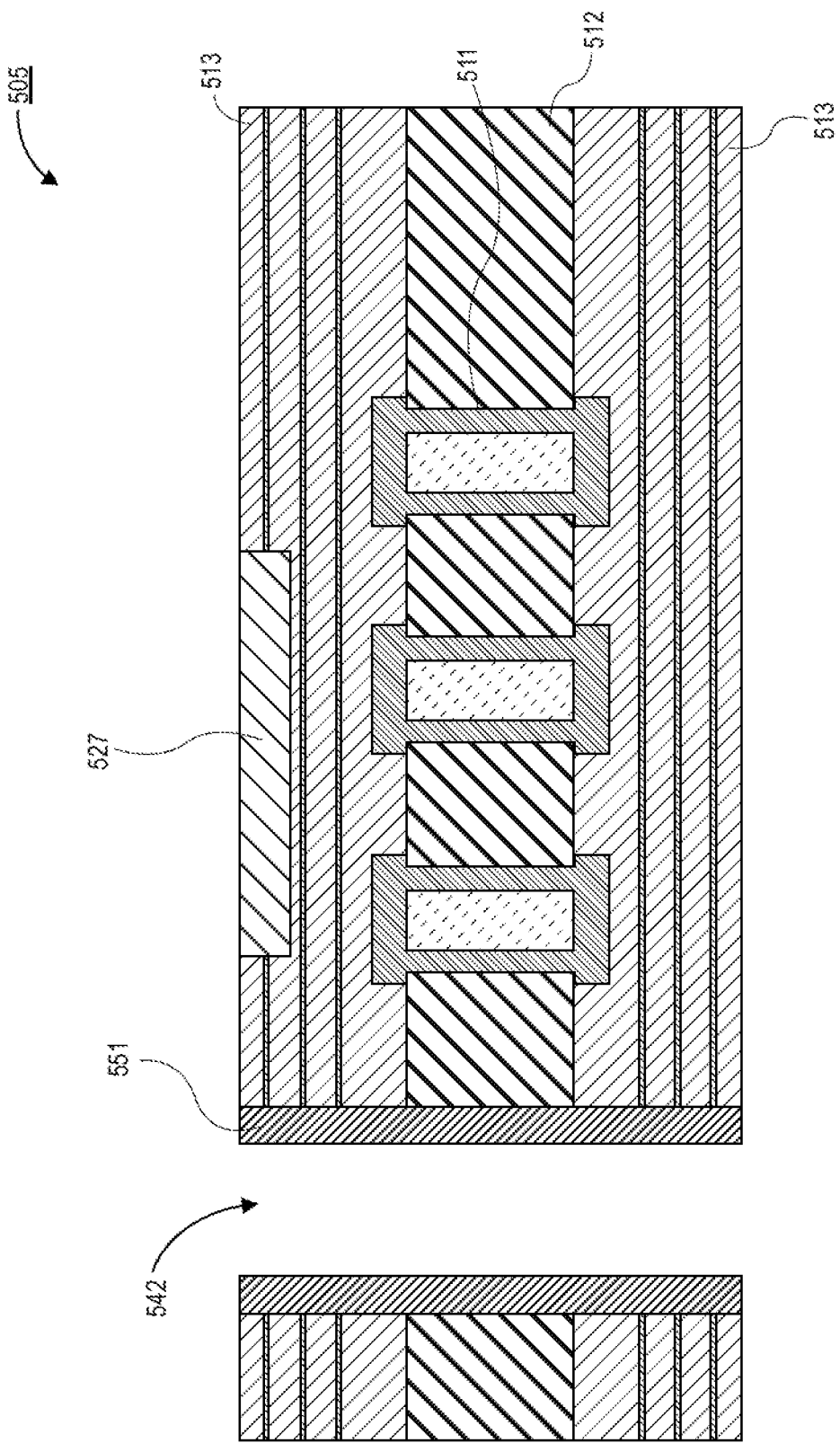
FIG. 5C is a cross-sectional illustration of the patch after a through hole is formed through the magnetic material to form a magnetic shell, in accordance with an embodiment.

Referring now to FIG. 5C, a cross-sectional illustration of the patch 505 after a second hole 542 is drilled through the magnetic plug 550 is shown, in accordance with an embodiment. In an embodiment, the drilling of the second hole 542 results in the plug 550 being transformed into a magnetic shell 551. The magnetic shell 551 may have an outer diameter that is substantially equal to the diameter of the hole 541.

Figure 5D:
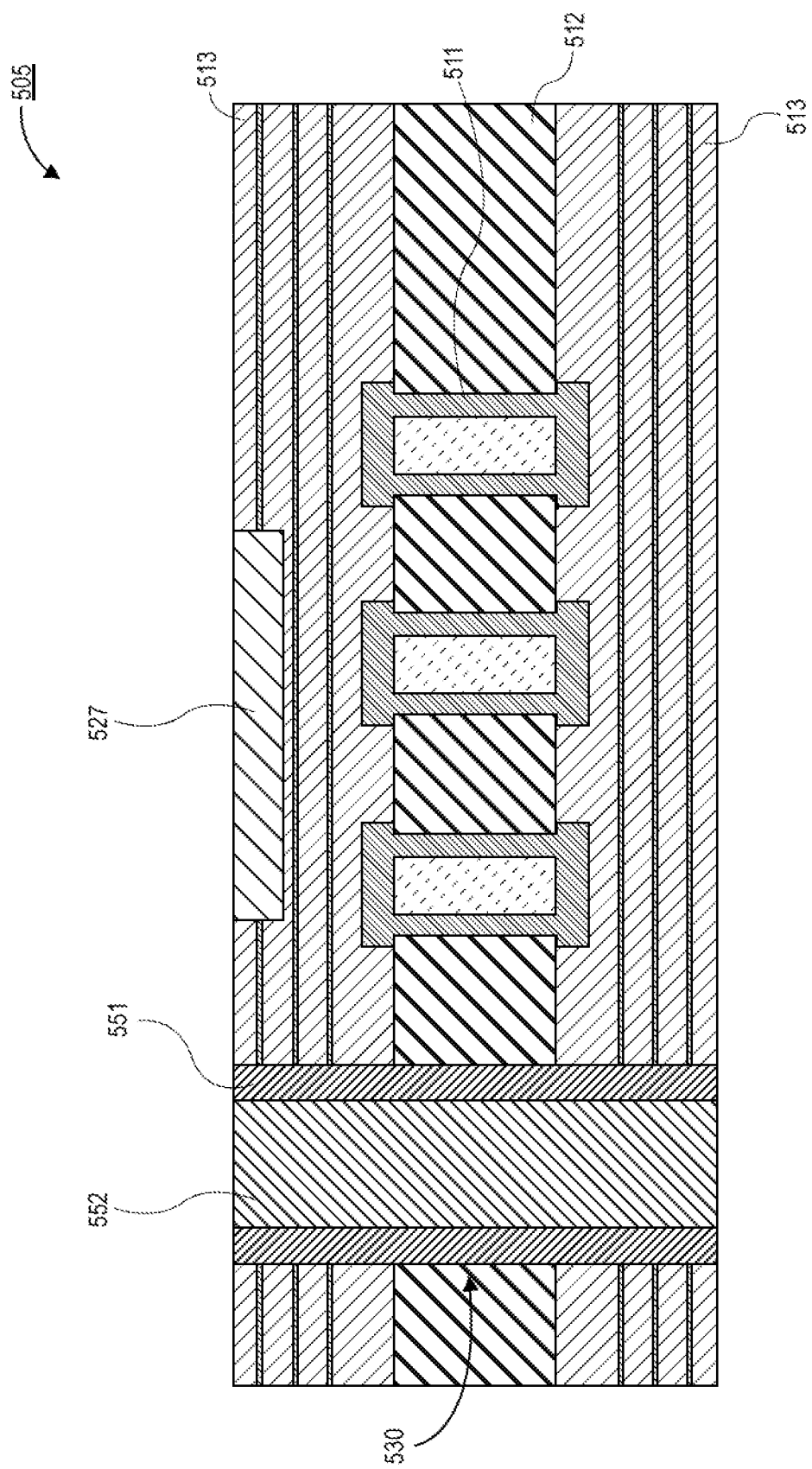
FIG. 5D is a cross-sectional illustration of the patch after an optically clear plug material is provided to fill the magnetic shell, in accordance with an embodiment.

Referring now to FIG. 5D, a cross-sectional illustration of the patch 505 after a plug 552 is provided in the second hole 542 is shown, in accordance with an embodiment. In an embodiment, the plug 552 may be an optically clear material. In an embodiment, the plug 552 may be disposed in the second hole 542 with a printing process or the like. The plug 552 and the magnetic shell 551 may structurally form a Faraday rotator 530.

Figure 5E:
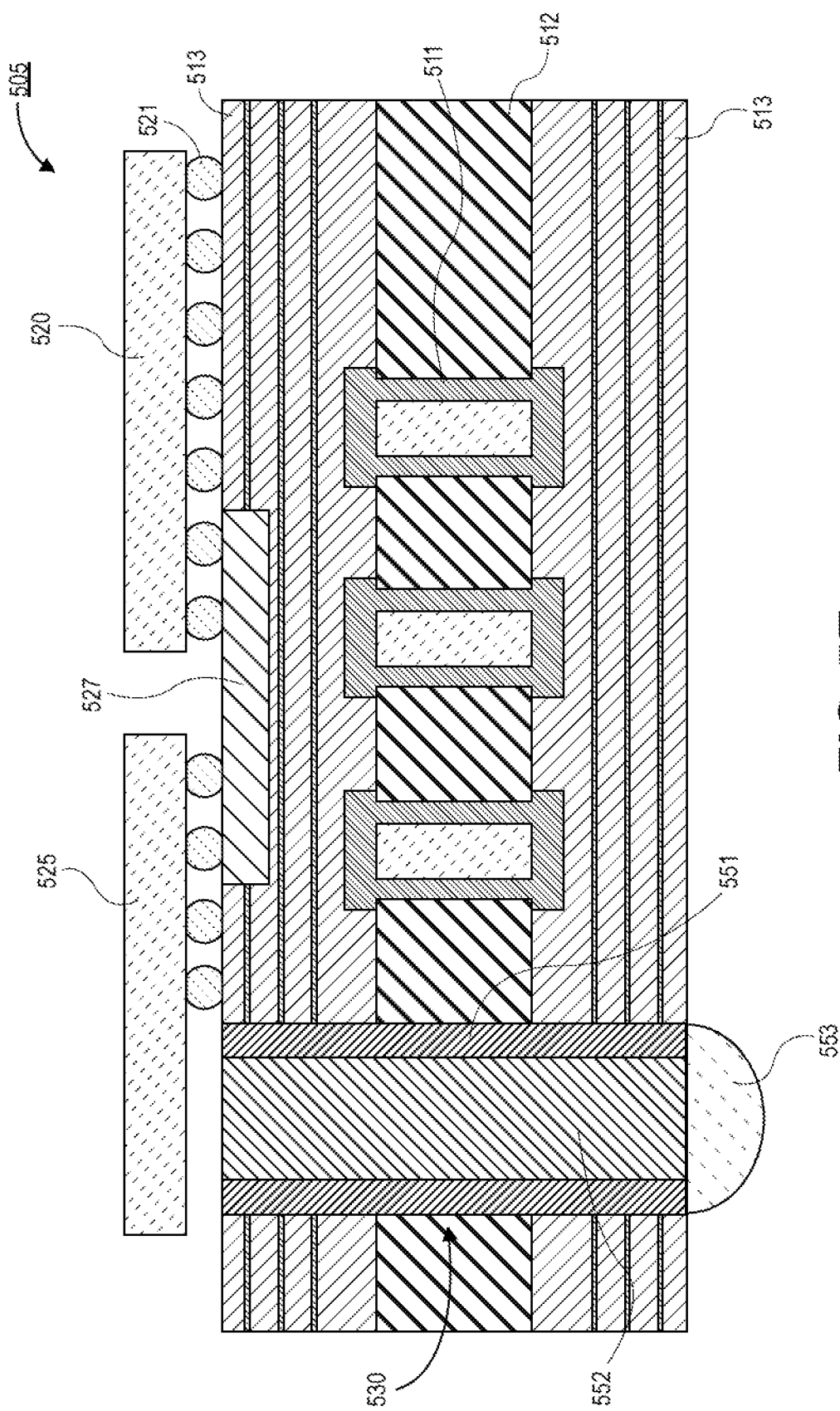
FIG. 5E is a cross-sectional illustration of the patch after a compute die and a photonics die are attached, in accordance with an embodiment.

Referring now to FIG. 5E, a cross-sectional illustration of the patch 505 after a lens 553, a photonics die 525, and a compute die 520 are attached to the patch 505 is shown, in accordance with an embodiment. In an embodiment, the lens 553 may be disposed over a bottom surface of the plug 552. The lens 553 allows for incoming optical signals to be focused in order to improve efficiency.

In an embodiment, the photonics die 525 and the compute die 520 may be attached to the patch 505 by interconnects 521. The interconnects are shown as solder balls, but it is to be appreciated that any FLI architecture may be used to connect the photonics die 525 and the compute die 520 to the patch 505. In an embodiment, the photonics die 525 is communicative coupled to the compute die 520 by the bridge 527 embedded in the top routing layers 513. In an embodiment, the photonics die 525 is positioned over the Faraday rotator 530. That is, the Faraday rotator 530 is within a footprint of the photonics die 525. As such, an optical signal passing through the Faraday rotator 530 may be optically coupled to a bottom surface of the photonics die 525.

After attachment of the photonics die 525 and the compute die 520, the patch 505 may be assembled with an electronic system, such as the electronic system 400 in FIG. 4. That is, the patch 505 may be arranged so that it overhangs an edge of an interposer. As such, room for attaching a connector (not shown in FIG. 5E) to lens 553 is provided.

In FIGS. 2-5E, the optical signal is coupled to the photonics die through a Faraday rotator that is positioned below the photonics die. Such an architecture requires overhanging the patch substrate over an edge of the interposer. However, embodiments are not limited to such architectures. For example, embodiments disclosed herein may also include providing the Faraday rotator above the photonics die. Examples of such embodiments are shown in FIGS. 6A-7D.

Figure 6A:
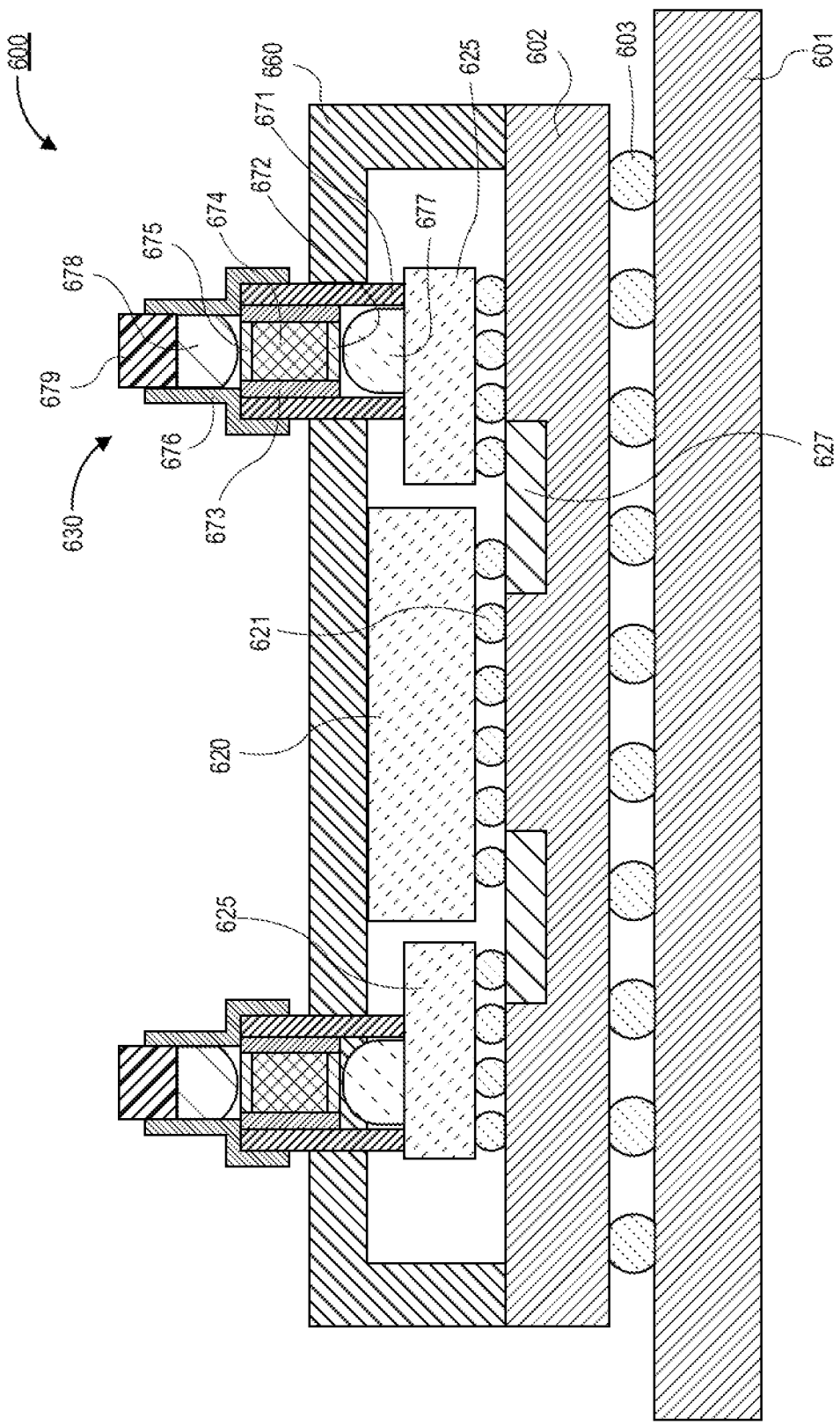
FIG. 6A is a cross-sectional illustration of a photonics package that comprises a Faraday rotator with a permanent magnetic shell, in accordance with an embodiment.

Referring now to FIG. 6A, a cross-sectional illustration of an electronic system 600 is shown, in accordance with an embodiment. In an embodiment, the electronic system 600 comprises a board 601 and a package substrate 602 attached to the board 601 by interconnects 603. While shown as solder balls, the interconnects 603 may comprise any interconnect architecture, such as sockets. In an embodiment, one or more embedded bridges 627 may be provided in the package substrate 602. The bridges 627 provide high density routing to communicatively couple photonics dies 625 to a compute die 620. The photonics dies 625 and the compute die 620 may be coupled to the package substrate 602 by interconnects 621. Interconnects 621 may comprise any FLI architecture. In an embodiment, an integrated heat spreader (IHS) 660 may be provided over the package substrate 602. The IHS 660 may be thermally coupled to the compute die 620. For example, a thermal interface material (TIM) (not shown) may be provided between the IHS 660 and the compute die 620.

In an embodiment, Faraday rotators 630 may pass through the IHS 660 and be optically coupled to the photonics dies 625. That is, the Faraday rotators 630 may be optically coupled to a top surface of the photonics dies 625. In an embodiment, the Faraday rotator 630 may comprise a tubular housing 671. A first polarizer 672 and a second polarizer 675 are provided in the housing 671. A magnetic shell 673 may be provided between the first polarizer 672 and the second polarizer 675. The magnetic shell 673 may be a permanent magnet in some embodiments. In the illustrated embodiment, the first polarizer 672 and the second polarizer 675 have a diameter that is substantially equal to an inner diameter of the magnetic shell 673. In such an embodiment, the first polarizer 672 and the second polarizer 675 may be positioned within the magnetic shell 673. However, in other embodiments, the first polarizer 672 and the second polarizer 675 may be on opposite ends of the magnetic shell 673 and be entirely outside the magnetic shell 673. In an embodiment, an optically clear plug 674 may be provided within an inner diameter of the magnetic shell 673.

The second polarizer 675 may be a vertical polarizer and the first polarizer 672 may be an angled polarizer (e.g., 45°). That is, the first polarizer 672 may be different than the second polarizer 675. In an embodiment, the magnetic shell 673 has a magnetic field that modifies the orientation of the incoming vertically polarized light. For example, the magnetic shell 673 may result in 45° polarized light in some embodiments.

In an embodiment, a first lens 677 may be provided within the housing 671. The lens 677 improves optical coupling between the Faraday rotator 630 and the photonics die 625. In an embodiment, a connector 676 is provided over and around an end of the housing 671. The connector 676 may be tubular and surround an end of the housing 671. The connector 676 may comprise a second lens 678 to focus optical signals coming into the Faraday rotator 630. The connector 676 may provide mechanical coupling of an optical fiber 679 to the Faraday rotator 630.

Figure 6B:
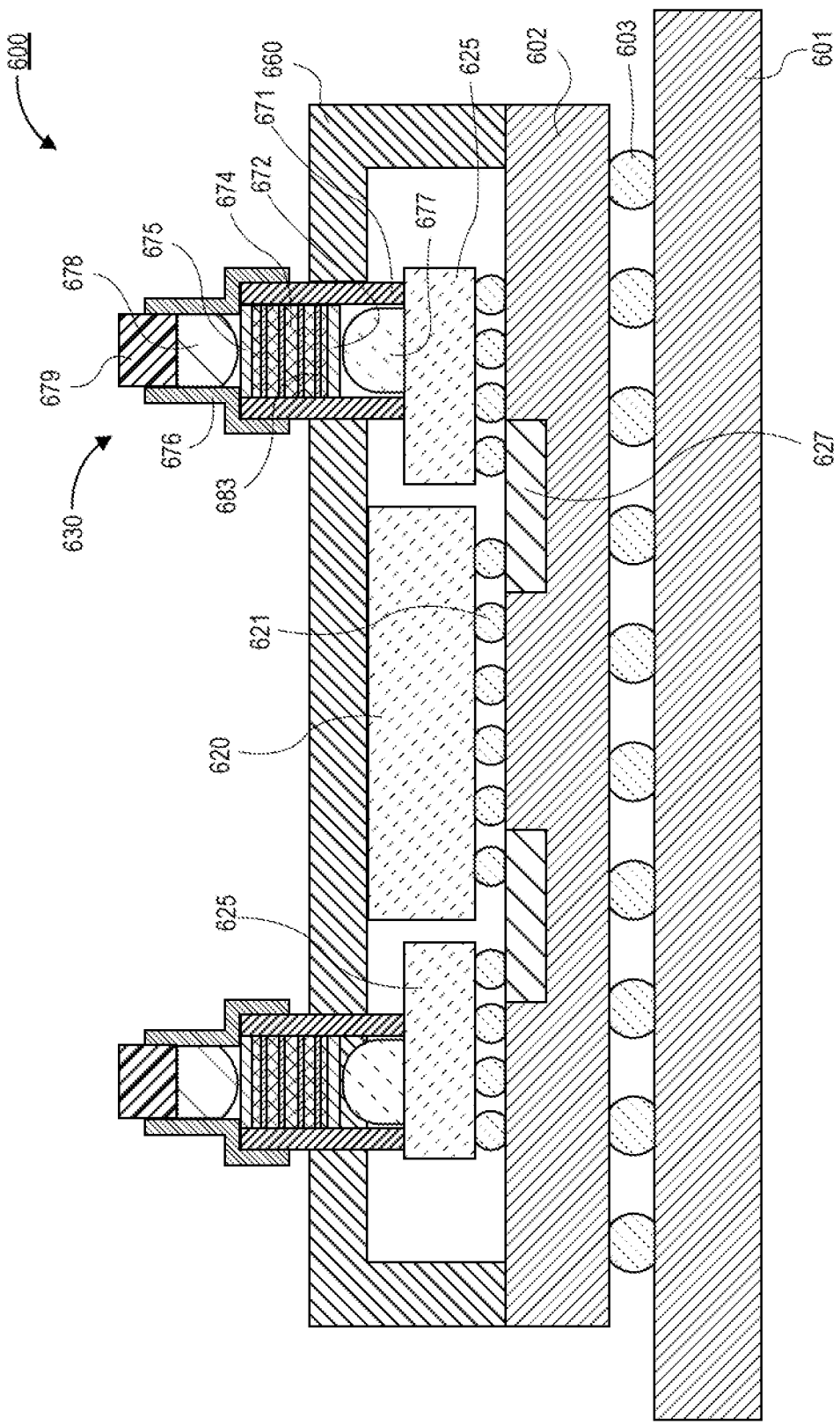
FIG. 6B is a cross-sectional illustration of a photonics package that comprises a Faraday rotator with an electromagnet coil, in accordance with an embodiment.

Referring now to FIG. 6B, a cross-sectional illustration of an electronic system 600 is shown, in accordance with an additional embodiment. In an embodiment, the electronic system 600 in FIG. 6B is substantially similar to the electronic system 600 in FIG. 6A, with the exception of there being a different magnet configuration in the Faraday rotator 630. Instead of providing a permanent magnet shell, a conductive coil 683 is provided between the first polarizer 672 and the second polarizer 675. The conductive coil 683 may be an electromagnet that is connected to a power source (not shown). Controlling the current that passes through the conductive coil 683 allows for a controllable magnetic field to be provided around the plug 674. As such, the incoming optical signal can have a tunable light polarization.

In FIGS. 6A and 6B, the Faraday rotators are discrete components that are assembled with the electronic systems 600. However, it is to be appreciated that various components of the Faraday rotator may also be fabricated in-situ with the assembly of the photonics die. An example of such an embodiment is shown in FIGS. 7A-7D.

Figure 7A:
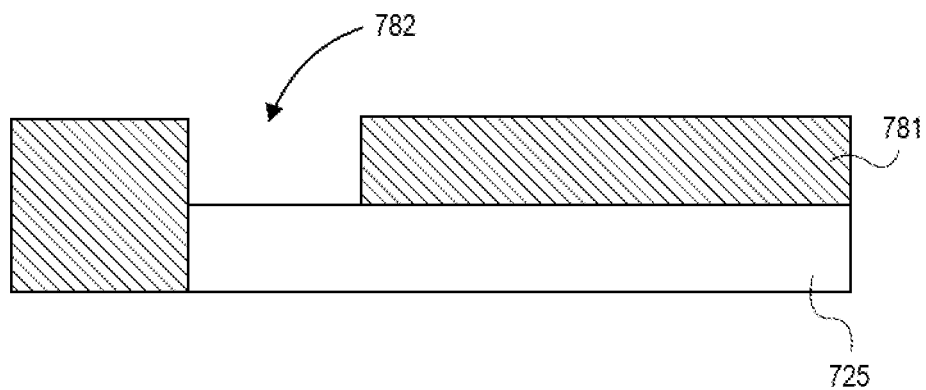
FIG. 7A is a cross-sectional illustration of a photonics die embedded in a package substrate with an opening through the package substrate to expose a surface of the photonics die, in accordance with an embodiment.

Referring now to FIG. 7A, a cross-sectional illustration of a portion of a photonics die 725 embedded in a dielectric layer 781 is shown, in accordance with an embodiment. In an embodiment, an opening 782 may be provided through the dielectric layer 781 to expose a top surface of the photonics die 725.

Figure 7B:
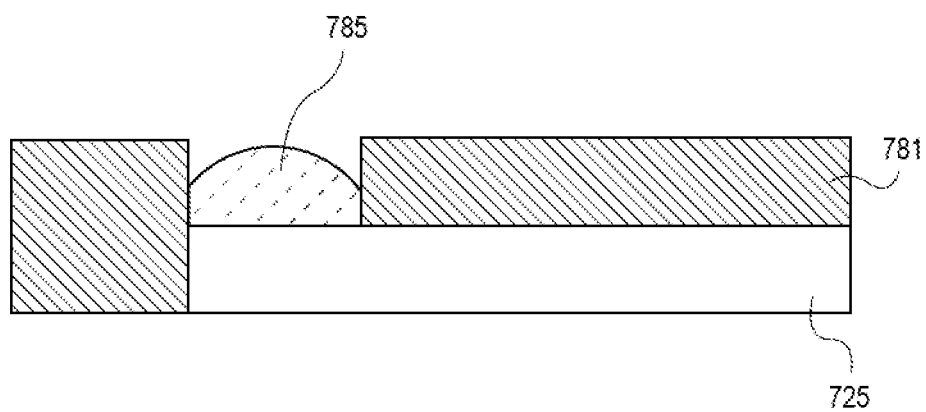
FIG. 7B is a cross-sectional illustration of the photonics die after a lens is formed over the exposed surface, in accordance with an embodiment.

Referring now to FIG. 7B, a cross-sectional illustration of the photonics die 725 after a lens 785 is formed is shown, in accordance with an embodiment. In an embodiment, the lens 785 may be disposed over the exposed top surface of the photonics die 725. The lens 785 may be formed by dispensing a liquid polymer droplet over the exposed top surface of the photonics die 725. The liquid polymer droplet may then be cured to lock in the shape of the lens 785.

Figure 7C:
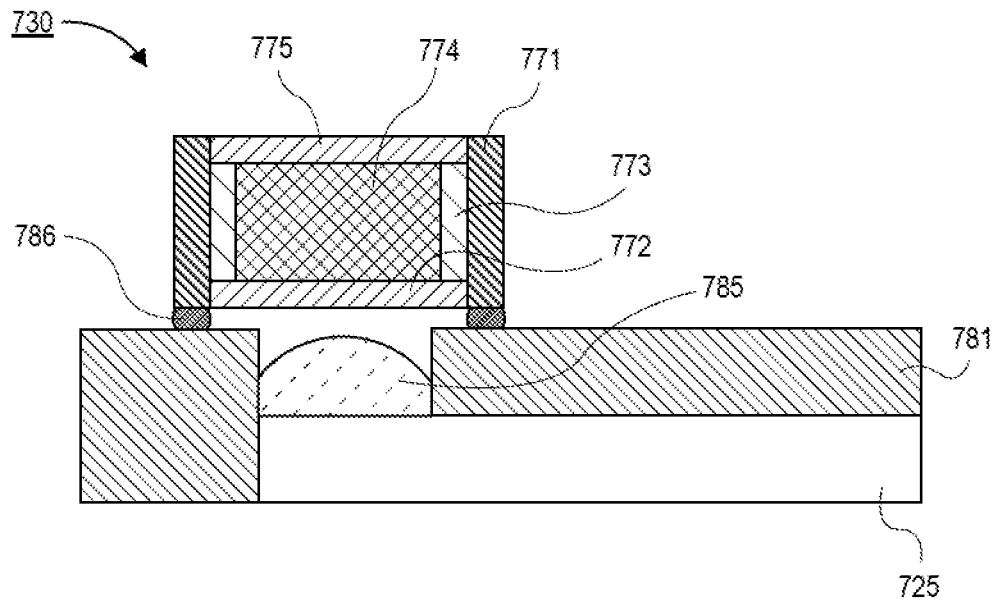
FIG. 7C is a cross-sectional illustration of the photonics die after a Faraday rotator is attached to the package substrate over the lens, in accordance with an embodiment.

Referring now to FIG. 7C, a cross-sectional illustration of the photonics die 725 after a Faraday rotator 730 is attached is shown, in accordance with an embodiment. In an embodiment, the Faraday rotator 730 may be attached to the dielectric layer 781 by an adhesive 786. For example, typical die mounting processes may be used to attach the Faraday rotator 730 to the dielectric layer 781.

In an embodiment, the Faraday rotator 730 may comprise a housing 771. The housing 771 may be a tubular housing in some embodiments. A first polarizer 772 and a second polarizer 775 may be provided within the housing 771. In an embodiment, a magnetic shell 773 may be provided between the first polarizer 772 and the second polarizer 775. The magnetic shell 773 may be a permanent magnet. However, in other embodiments, the magnetic shell 773 may be replaced with a conductive coil, similar to the embodiment shown in FIG. 6B. In an embodiment, the magnetic shell 773 may be entirely between the first polarizer 772 and the second polarizer 775. In other embodiments, the first polarizer 772 may be at a first end of the magnetic shell 773 and surrounded by the magnetic shell 773, and the second polarizer 775 may be at a second end of the magnetic shell 773 and surrounded by the magnetic shell 773. In an embodiment, an optically clear plug 774 may be provided within the magnetic shell 773.

The second polarizer 775 may be a vertical polarizer and the first polarizer 772 may be an angled polarizer (e.g., 45°). That is, the first polarizer 772 may be different than the second polarizer 775. In an embodiment, the magnetic shell 773 has a magnetic field that modifies the orientation of the incoming vertically polarized light. For example, the magnetic shell 773 may result in 45° polarized light in some embodiments.

Figure 7D:
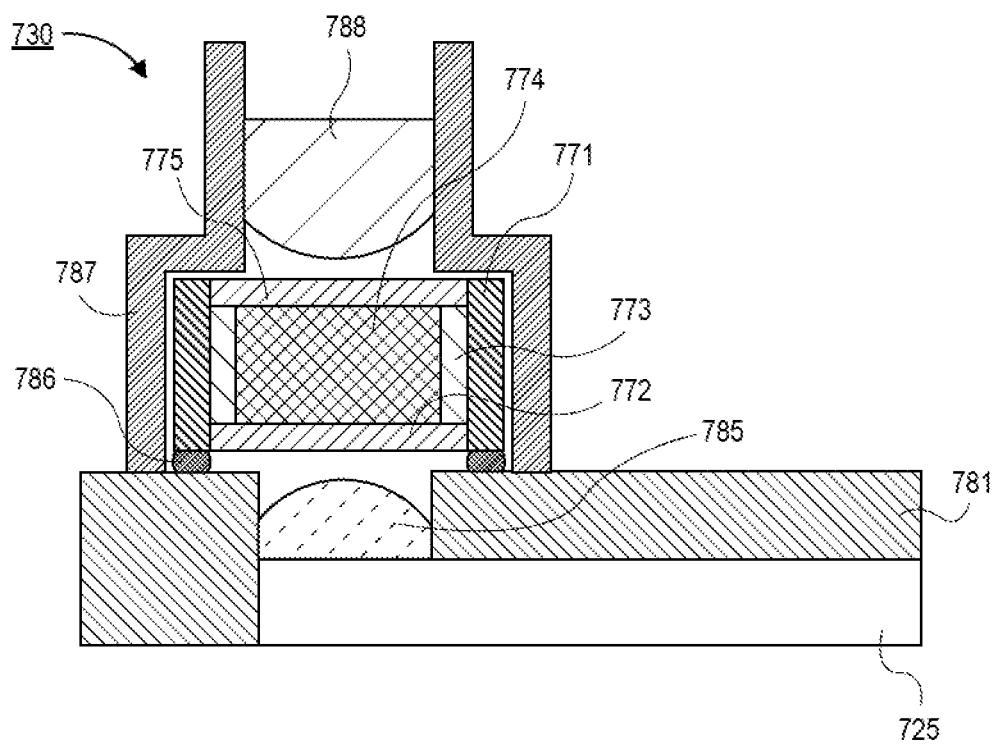
FIG. 7D is a cross-sectional illustration of the photonics die after a connector is attached over and around the Faraday rotator, in accordance with an embodiment.

Referring now to FIG. 7D, a cross-sectional illustration of the photonics die 725 after a connector 787 is disposed over the Faraday rotator 730 is shown, in accordance with an embodiment. The connector 787 may be tubular and fit around the housing 771. In an embodiment, a lens 788 may be provided in the connector 787.

In an embodiment, a portion of the Faraday rotator 730 may pass through an IHS (not shown) above the photonics die 725. In other embodiments, the Faraday rotator 730 may be entirely below the IHS, with only an optical cable passing through the IHS.

Figure 8:
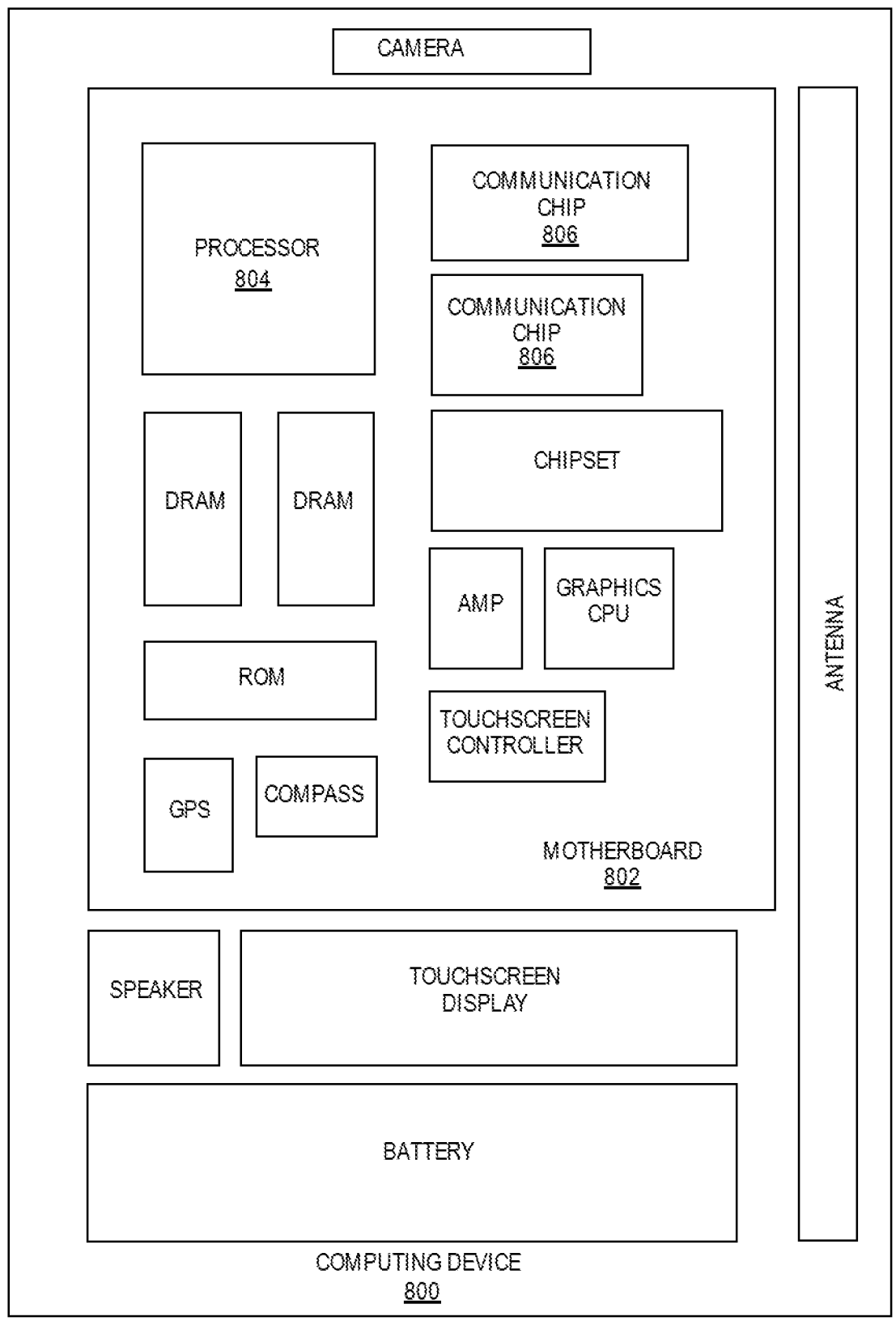
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic system with a photonics die that is optically coupled to a Faraday rotator, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic system with a photonics die that is optically coupled to a Faraday rotator, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a photonics package, comprising: an interposer; a patch over the interposer, wherein the patch overhangs an edge of the interposer; a photonics die on the patch; and a Faraday rotator passing through a thickness of the patch, wherein the Faraday rotator is below the photonics die.

Example 2: the photonics package of Example 1, wherein the Faraday rotator comprises: a tube; a first polarizer in the tube; a second polarizer in the tube; and a magnetic region between the first polarizer and the second polarizer.

Example 3: the photonics package of Example 2, wherein the Faraday rotator further comprises: a first lens in the tube; and a second lens in the tube, wherein the first polarizer and the second polarizer are between the first lens and the second lens.

Example 4: the photonics package of Example 2 or Example 3, further comprising: a connector over an end of the tube; and an optical cable coupled to the connector.

Example 5: the photonics package of Example 4, wherein the connector is on a surface of the patch opposite from the photonics die.

Example 6: the photonics package of Examples 2-5, further comprising: a dielectric shell around the tube, wherein the dielectric shell mechanically couples the tube to the patch.

Example 7: the photonics package of Examples 1-6, further comprising:
an opening through the patch, wherein the Faraday rotator is provided in the opening.

Example 8: The photonics package of Example 7, wherein the Faraday rotator comprises: a magnetic shell in the opening; and an optically clear plug within the magnetic shell.

Example 9: the photonics package of Example 8, further comprising: a lens over the optically clear plug on a surface of the patch opposite from the photonics die.

Example 10: the photonics package of Example 9, further comprising: an optical cable connected to the lens.

Example 11: the photonics package of Examples 1-10, further comprising: a compute die over the patch.

Example 12: the photonics package of Example 11, wherein the compute die is communicatively coupled to the photonics die by a bridge embedded in the patch.

Example 13: a patch for an electronic package, wherein the patch comprises: a patch substrate, wherein the patch substrate comprises a core and routing layers above and below the core; and a Faraday rotator passing through a thickness of the patch substrate.

Example 14: the patch of Example 13, wherein the Faraday rotator comprises: a tube; a first polarizer in the tube; a second polarizer in the tube; and a magnetic region between the first polarizer and the second polarizer.

Example 15: the patch of Example 13, wherein the Faraday rotator comprises: a magnetic shell passing through the thickness of the patch substrate; and an optically clear plug filling the interior of the magnetic shell.

Example 16: the patch of Examples 13-15, further comprising: a photonics die over the patch substrate, wherein the photonics die is above the Faraday rotator.

Example 17: the patch of Example 16, further comprising: a compute die over the patch substrate, wherein the compute die is communicatively coupled to the photonics die by a bridge embedded in the patch substrate.

Example 18: an electronic system, comprising: a board; an interposer over the board; a patch over the interposer, wherein the patch overhangs an edge of the interposer; a photonics die over the patch; a compute die over the patch, wherein the compute die is communicatively coupled to the photonics die by a bridge embedded in the patch; and a Faraday rotator passing through a thickness of the patch.

Example 19: the electronic system of Example 18, wherein the Faraday rotator comprises: a tube; a first polarizer in the tube; a second polarizer in the tube; and a magnetic region between the first polarizer and the second polarizer.

Example 20: the electronic system of Example 18, wherein the Faraday rotator comprises: a magnetic shell passing through the thickness of the patch; and an optically clear plug filling the interior of the magnetic shell.

What is claimed is:

1. A photonics package, comprising:
an interposer;
a patch over the interposer, the patch vertically separated from the interposer, and the patch coupled to the interposer by a plurality of interconnects, wherein the patch overhangs an edge of the interposer;
a photonics die on the patch; and
a Faraday rotator in an opening passing through a thickness of the patch, wherein the opening and the Faraday rotator are in a portion of the patch that overhangs the edge of the interposer, wherein the Faraday rotator is below the photonics die, and wherein the photonics die is vertically overlapping with the opening.

2. The photonics package of claim 1, wherein the Faraday rotator comprises:
a tube;
a first polarizer in the tube;
a second polarizer in the tube; and
a magnetic region between the first polarizer and the second polarizer.

3. The photonics package of claim 2, wherein the Faraday rotator further comprises:
a first lens in the tube; and
a second lens in the tube, wherein the first polarizer and the second polarizer are between the first lens and the second lens.

4. The photonics package of claim 2, further comprising:
a connector over an end of the tube; and
an optical cable coupled to the connector.

5. The photonics package of claim 4, wherein the connector is on a surface of the patch opposite from the photonics die.

6. The photonics package of claim 2, further comprising:
a dielectric shell around the tube, wherein the dielectric shell mechanically couples the tube to the patch.

7. The photonics package of claim 1, further comprising:
an opening through the patch, wherein the Faraday rotator is provided in the opening.

8. The photonics package of claim 7, wherein the Faraday rotator comprises:
a magnetic shell in the opening; and
an optically clear plug within the magnetic shell.

9. The photonics package of claim 8, further comprising:
a lens over the optically clear plug on a surface of the patch opposite from the photonics die.

10. The photonics package of claim 9, further comprising:
an optical cable connected to the lens.

11. The photonics package of claim 1, further comprising:
a compute die over the patch.

12. The photonics package of claim 11, wherein the compute die is communicatively coupled to the photonics die by a bridge embedded in the patch.

13. A patch for an electronic package, wherein the patch comprises:
a patch substrate for coupling to separate interposer by a plurality of interconnects, wherein the patch substrate comprises a core and routing layers above and below the core;
a Faraday rotator in an opening passing through a thickness of the patch substrate, wherein the opening and the Faraday rotator are in a portion of the patch for overhanging an edge of the interposer; and
a photonics die over the patch substrate, wherein the photonics die is above the Faraday rotator, and wherein the photonics die is vertically overlapping with the opening.

14. The patch of claim 13, wherein the Faraday rotator comprises:
a tube;
a first polarizer in the tube;
a second polarizer in the tube; and
a magnetic region between the first polarizer and the second polarizer.

15. The patch of claim 13, wherein the Faraday rotator comprises:
a magnetic shell passing through the thickness of the patch substrate; and
an optically clear plug filling the interior of the magnetic shell.

16. The patch of claim 13, further comprising:
a compute die over the patch substrate, wherein the compute die is communicatively coupled to the photonics die by a bridge embedded in the patch substrate.

17. An electronic system, comprising:
a board;
an interposer over the board;
a patch over the interposer, the patch vertically separated from the interposer, and the patch coupled to the interposer by a plurality of interconnects, wherein the patch overhangs an edge of the interposer;
a photonics die over the patch;
a compute die over the patch, wherein the compute die is communicatively coupled to the photonics die by a bridge embedded in the patch; and
a Faraday rotator in an opening passing through a thickness of the patch, wherein the opening and the Faraday rotator are in a portion of the patch that overhangs the edge of the interposer, wherein the Faraday rotator is below the photonics die, and wherein the photonics die is vertically overlapping with the opening.

18. The electronic system of claim 17, wherein the Faraday rotator comprises:
a tube;
a first polarizer in the tube;
a second polarizer in the tube; and
a magnetic region between the first polarizer and the second polarizer.

19. The electronic system of claim 17, wherein the Faraday rotator comprises:
a magnetic shell passing through the thickness of the patch; and
an optically clear plug filling the interior of the magnetic shell.

* * * * *